(12) United States Patent
Li et al.

(10) Patent No.: US 11,112,445 B2
(45) Date of Patent: Sep. 7, 2021

(54) TRAVELLING WAVE PILOT PROTECTION OF A TRANSMISSION LINE BASED ON TIME SYNCHRONIZATION

(71) Applicant: ABB Power Grids Switzerland AG, Baden (CH)

(72) Inventors: YouYi Li, Västerås (SE); Jianping Wang, Västerås (SE); Kai Liu, Beijing (CN)

(73) Assignee: ABB POWER GRIDS SWITZERLAND AG, Baden (CH)

(*) Notice: Subject to any disclaimer, the term of this patent is extended or adjusted under 35 U.S.C. 154(b) by 369 days.

(21) Appl. No.: 15/570,493

(22) PCT Filed: May 28, 2015

(86) PCT No.: PCT/EP2015/061773
§ 371 (c)(1),
(2) Date: Oct. 30, 2017

(87) PCT Pub. No.: WO2016/188574
PCT Pub. Date: Dec. 1, 2016

(65) Prior Publication Data
US 2018/0143238 A1 May 24, 2018

(51) Int. Cl.
*G01R 31/08* (2020.01)
*G01R 31/327* (2006.01)
*H02H 7/26* (2006.01)

(52) U.S. Cl.
CPC ......... *G01R 31/085* (2013.01); *G01R 31/088* (2013.01); *G01R 31/3274* (2013.01); *G01R 31/3275* (2013.01); *H02H 7/265* (2013.01); *H02H 7/263* (2013.01)

(58) Field of Classification Search
CPC .................. G01R 31/085; G01R 31/088; G01R 31/3274; G01R 31/3275; G01R 31/08; H02H 7/263; H02H 7/265; Y04S 10/522; H04L 2012/5674
USPC ........ 324/520; 361/42; 700/286; 702/58–60, 702/65, 79, 125
See application file for complete search history.

(56) References Cited

U.S. PATENT DOCUMENTS

| | | |
|---|---|---|
| 3,878,460 A | 4/1975 | Nimmersjo |
| 4,524,446 A * | 6/1985 | Sun ...................... H02H 1/0084 324/123 R |
| 4,570,231 A | 2/1986 | Bunch |

(Continued)

FOREIGN PATENT DOCUMENTS

| | | |
|---|---|---|
| CN | 101640410 A | 2/2010 |
| WO | 2013056144 A1 | 4/2013 |

OTHER PUBLICATIONS

International Preliminary Report on Patentability Application No. PCT/EP2015/061773 Completed: Sep. 8, 2017 15 pages.

(Continued)

*Primary Examiner* — Jeffrey P Aiello
(74) *Attorney, Agent, or Firm* — Slater Matsil, LLP

(57) ABSTRACT

A mechanism for travelling wave pilot protection of a transmission line and method for receiving indications of a travelling wave from two terminals of a transmission line, wherein two terminals are time synchronized. The method includes making a trip decision based on the indications using a short trip window. An arrangement is configured to perform the disclosed method.

20 Claims, 2 Drawing Sheets

(56) References Cited

U.S. PATENT DOCUMENTS

| | | | | |
|---|---|---|---|---|
| 4,591,940 A * | 5/1986 | Sun | .................... | H02H 1/0084 361/66 |
| 4,733,195 A * | 3/1988 | Tserng | .................... | H03F 3/607 330/286 |
| 6,795,538 B1 * | 9/2004 | Olson | .................... | H04L 25/14 370/329 |
| 6,879,917 B2 | 4/2005 | Turner | | |
| 7,535,233 B2 * | 5/2009 | Kojovic | ............. | G01R 31/085 324/509 |
| 8,154,836 B2 * | 4/2012 | Kasztenny | ............ | H04J 3/0667 361/62 |
| 8,781,766 B2 * | 7/2014 | Schweitzer, III | .... | G01R 31/085 702/57 |
| 2007/0217105 A1 * | 9/2007 | Christensen | ........... | H02H 3/025 361/89 |
| 2012/0206149 A1 * | 8/2012 | Su | .......................... | H02H 3/402 324/509 |
| 2014/0074414 A1 * | 3/2014 | Schweitzer, III | .... | G01R 31/085 702/59 |
| 2015/0349536 A1 * | 12/2015 | Davidson | ................ | H02M 1/15 307/80 |
| 2018/0106849 A1 * | 4/2018 | Burek | .................... | H02H 7/265 |
| 2018/0143238 A1 * | 5/2018 | Li | ........................ | G01R 31/085 |

OTHER PUBLICATIONS

International Search Report and Written Opinion of the International Searching Authority Application No. PCT/EP2015/061773 Completed: Jan. 29, 2016; dated Feb. 8, 2016 12 pages.

Written Opinions of the International Preliminary Examining Authority Application No. PCT/EP2015/061773 dated May 24, 2017 7 pages.

* cited by examiner

TRAVELLING WAVE PILOT PROTECTION OF A TRANSMISSION LINE BASED ON TIME SYNCHRONIZATION

TECHNICAL FIELD

Embodiments presented herein relate to travelling wave pilot protection of a transmission line, and particularly to a method and an arrangement for travelling wave pilot protection of a transmission line.

BACKGROUND

Consider a regional power system having a strong internal transmission system transmitting power to another strong regional system on relatively weak Interties. Such a regional power system may experience issues with stability during disturbances, such as short circuits, loss of generation, loss of load, loss of one of the Interties, or any combination thereof. Prevalent practice to the solution of these issues is to include more Interties, increase the voltage to higher voltage levels (such as extra high voltage (EHV) levels or ultra high voltage (UHV) levels), or both. Another approach for better power system stability is to employ protection relays with high operation speed.

Travelling wave protection is one approach for super-high speed protection. There are different types of travelling wave protections, for example, travelling wave pilot protection based on directional comparison, travelling wave current differential protection, travelling wave protection based on distance measurements, etc.

Pilot protection is a practical and reliable mechanism for travelling wave protection. It only needs a small bandwidth channel to transmit binary information between terminals at end points of a transmission line.

One travelling wave protection mechanism is RALDA. Properties of such a travelling wave protection mechanism are, for example, disclosed in U.S. Pat. No. 3,878,460(A). U.S. Pat. No. 3,878,460(A) relates to an arrangement for detecting the direction of a fault from a measuring point. In short, in RALDA the polarities of the first wave fronts of local voltage and current are compared. If the polarities are the same, a backward fault is detected. If the polarities are each others reverse, a forward fault has occurred. Protection relays at a terminal will transmit the fault direction to other terminals. If both directions are forward directions, it means that an internal fault has occurred. Otherwise, it means that an external fault has occurred.

However, the security of travelling wave mechanisms such as RALDA may be influenced by harmonics. Under some conditions, the harmonics may lead to wrong detection of forward faults at both sides of the protected line, and thereby, it may finally lead to mal-trip according to the directional pilot protection principle. So, there is still a need for an improved protection of a transmission line.

SUMMARY

An object of embodiments herein is to provide efficient protection of a transmission line.

The inventor of there herein disclosed embodiments has discovered that communications in existing pilot protection schemes (including RALDA) is unsynchronized. In more detail, this means that unsynchronized binary information is exchanged between different terminals to implement logics for determining whether to block or unblock (also known as forward/backward) in pilot protection schemes. Because the data is unsynchronized and the transmitted signal delay is uncertain, the logics has to hold the blocking/unblocking signal (or forward/backward direction signal) for a long period of time. The long hold time leads to a long open window for making trip decisions. As a result thereof, the probability of mal-trip is increased.

According to a first aspect there is presented a method for travelling wave pilot protection of a transmission line. The method comprises receiving indications of a travelling wave from two terminals of a transmission line, wherein said two terminals are time synchronized. The method comprises making a trip decision based on the indications using a short trip window.

Advantageously this enables secure travelling wave pilot protection.

According to a second aspect there is presented an arrangement for travelling wave pilot protection of a transmission line. The arrangement comprises a processing unit. The processing unit is configured to cause the arrangement to receive indications of a travelling wave from two terminals of a transmission line, wherein said two terminals are time synchronized. The processing unit is configured to cause the arrangement to make a trip decision based on the indications using a short trip window.

According to a third aspect there is presented a computer program for travelling wave pilot protection of a transmission line, the computer program comprising computer program code which, when run on a processing unit of an arrangement, causes the arrangement to perform a method according to the first aspect.

According to a fourth aspect there is presented a computer program product comprising a computer program according to the third aspect and a computer readable means on which the computer program is stored.

It is to be noted that any feature of the first, second, third and fourth aspects may be applied to any other aspect, wherever appropriate. Likewise, any advantage of the first aspect may equally apply to the second, third, and/or fourth aspect, respectively, and vice versa. Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which.

DETAILED DESCRIPTION

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description. Any step or feature illustrated by dashed lines should be regarded as optional.

As noted above there are issues with existing mechanisms for travelling wave pilot protection.

As will be disclosed hereinafter, the proposed travelling wave pilot protection of a transmission line is based on time synchronization and a short trip window. This will enhance the security.

Figure 1:
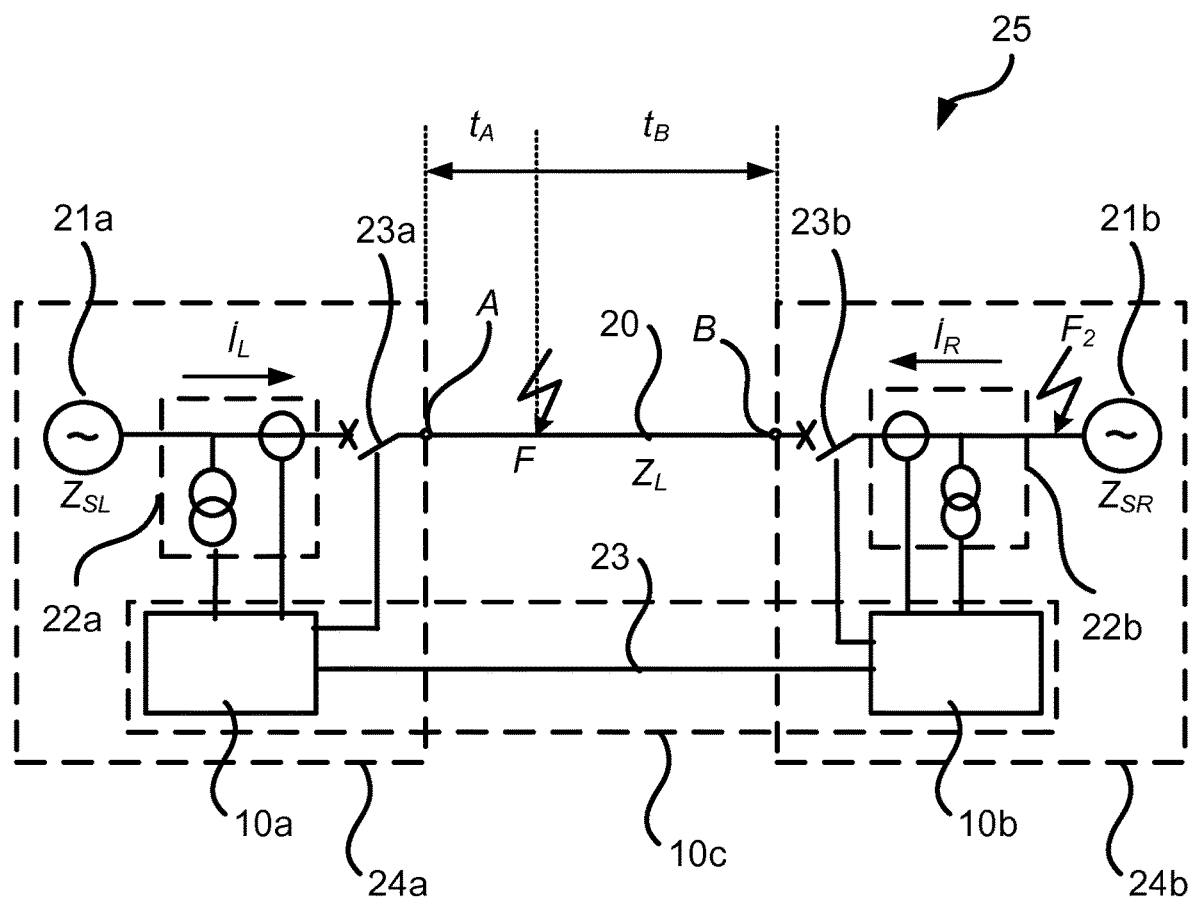
FIG. 1 is a schematic diagram illustrating a power distribution system according to embodiments.
Figure 5:
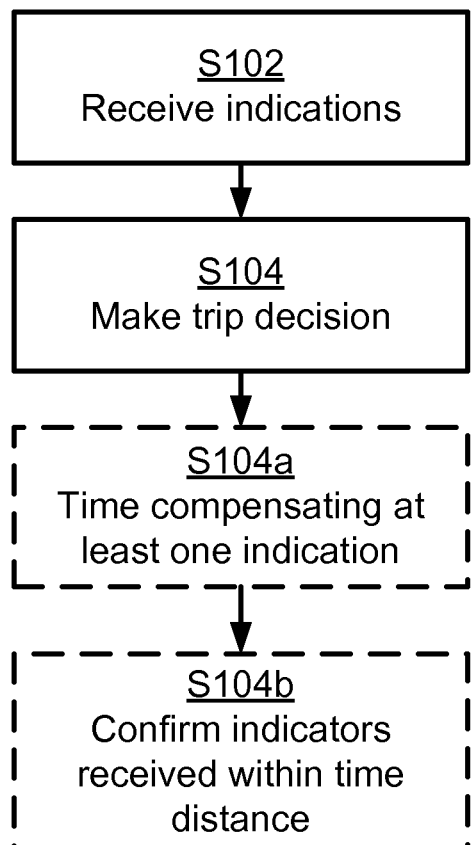
FIG. 5 is a flowchart of methods according to embodiments.

Hence, there is provided a method for travelling wave pilot protection of a transmission line. The method is performed by an arrangement 10a, 10b, 10c. Reference is now made to the flowchart of FIG. 5. Parallel reference is made to the power distribution system 25 of FIG. 1 disclosing an embodiment wherein the herein disclosed invention may be applied.

The power distribution system 25 comprises at least one arrangement 10a, 10b for travelling wave pilot protection of the transmission line 20. Reference symbols A and B symbolize the end-points (towards the transmission line 20) of two terminals; terminal A, and terminal B, respectively. The symbol F denotes a fault along the transmission line 20.

Two or more arrangements 10a, 10b may be operatively connected via a communications link 23. Further, two or more arrangements 10a, 10b may be part of a common arrangement 10c for travelling wave pilot protection of the transmission line 20. The arrangement 10a, 10b may be part of, or comprise, intelligent electronic devices (IEDs) operating as protection relays.

The power distribution system 25 further comprises power sources 21a, 21b, current and voltage transformers 22a, 22b, and circuit breakers 23a, 23b. Each terminal A, B, may comprise at least one power source, current and voltage transformer, and circuit breaker.

The method comprises, in a step S102, receiving indications of a travelling wave from two terminals A, B of a transmission line 20. Each indication may be provided by binary information, such as synchronized binary information, representing travelling wave polarity, fault direction, blocking signal, unblocking signal, and/or trip signal for a fault (F) along the transmission line 20. Alternatively, each indication may be the arrival time of the travelling wave at the respective terminal A, B. The two terminals A, B are time synchronized. The terminals A, B may have a combined time synchronization error less than 0.2 ms.

The method comprises, in a step S104, making a trip decision based on the indications using a short trip window. The short trip window may have a length in time corresponding to 2-6 ms, preferably 2-4 ms, which is shorter than the hold time, or trip window, in existing pilot protection mechanisms, for example, 20-50 ms.

Disturbance by harmonics or noise may lead to wrong detection of forward direction faults, which may even cause mal-trip in some cases. Assuming the mal-trip probability by noise or disturbance having a uniform distribution in time domain, a short (exposure) trip window will decrease the risk of mal-trips.

Embodiments relating to further details of the herein disclosed method and arrangement for travelling wave pilot protection of a transmission line will now be disclosed. General references are continued to the flowchart of FIG. 5 and the power distribution system 25 of FIG. 1.

According to one embodiment, making the trip decision comprises a step S104b of confirming that the indications from the two terminals relate to the same travelling wave. This may be accomplished by confirming that travelling wave information detected from the two different terminals relate to the same fault disturbance by checking if they occur within the same short trip (time) window. Hence, that the indications from the two terminals relate to the same travelling wave is confirmed only if the indications are received within a certain time distance of each other. This certain time distance corresponds to the length (in time) of short trip window. Conversely, if the indications are received within a time distance from each other that is longer than the short trip window then it is not confirmed that the indications from the two terminals relate to the same travelling wave and hence represent a fault disturbance. The step S104b may be preceded by a step S104a of time compensating at least one of the indications.

In order to implement the step S104b of confirming, a time counter may be triggered to start counting time once a first indication from one of the terminals A, B is received and triggered to stop counting time once a second indication from the other of the terminals A, B is received. If the time lapsed by the time counter is at most equal to the length of the short trip window then it may be determined that the two indications were caused by the same fault disturbance and indeed received within the short trip window.

There may be different ways to make the trip decision. According to an embodiment the trip decision relates to whether or not to cause a circuit breaker 23a, 23b to trip. As the skilled person understands, there may be different ways to determine whether or not to cause the circuit breaker 23a, 23b to trip. For example, with reference to step S104a, a trip decision to cause a circuit breaker 23a, 23b to trip is only made if the indications of the travelling wave from the two terminals A, B are received within the short trip window.

There may be different types of transmission line to which the travelling wave pilot protection may be applied. For example, as disclosed above, the transmission line 20 may be part of a power distribution system 25. The transmission line 20 may either be an alternating current (AC) transmission line or a direct current (DC) transmission line.

The fault F may only be detected if the indications from the two terminals are received within the above-specified time interval.

If the fault F occurs at the middle of the transmission line, the arrival times of the travelling waves $t_A$ and $t_B$, respectively, at the two terminals A and B are the same. Otherwise, the arrival times will be different.

Consider now the worst condition, namely that the fault F occurs at the beginning or end of the transmission line 25 to be protected. The largest time difference is:

$$|t_A - t_B| = \frac{\text{line length}}{\text{light velocity}}$$

In AC power systems, most of the transmission lines are shorter than 300 km (i.e., the line length is at most 300 km). This means that the time difference $|t_A-t_B|$ is less than 1 ms since the speed of light (denoted by the light velocity in the above equation) is about 300000 km/s.

For example, assuming the synchronization error between the two terminals A and B to be less than 0.2 ms, a small trip window (such as 2-6 ms, depending on the line length and dispersion of fault detection time) can ensure indications of two 'forward directions' are coming from the same fault. This can decrease the possibility of the mal-trip at a low cost; if the travelling wave pilot protection works with line differential protection function, data communication for the travelling wave pilot protection may share the same time synchronization mechanism which is implemented for the communication of analogue data for differential protection, for example based on communications channels with echo based time synchronization.

Figure 2:
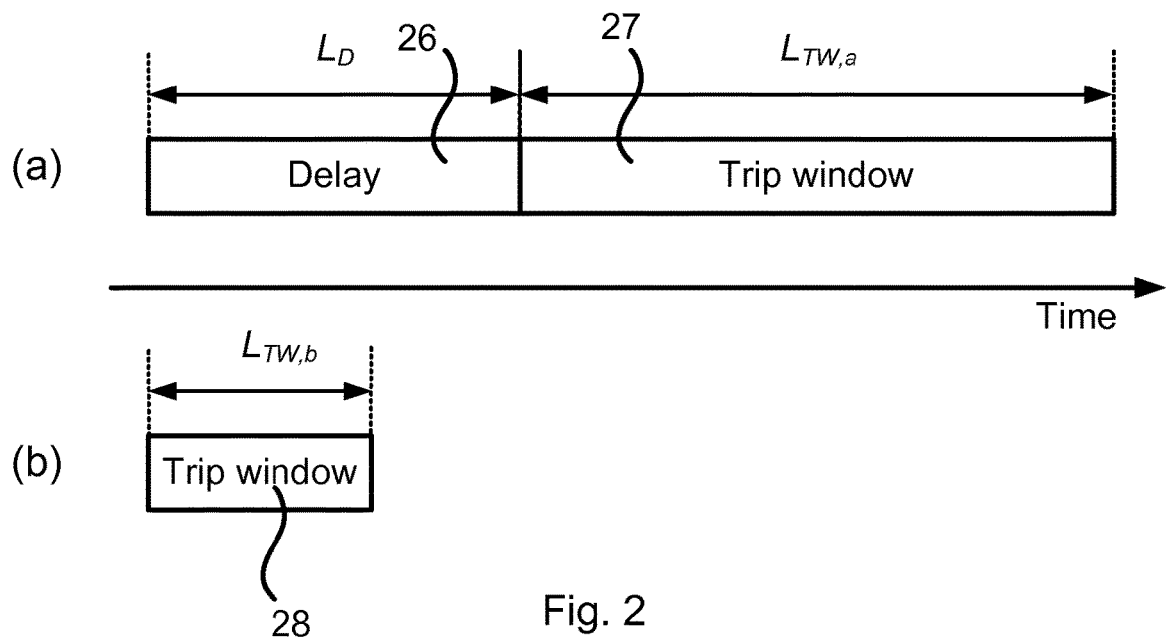
FIG. 2 is a schematic diagram illustrating a comparison between trip window lengths.

A comparison between two trip window arrangements is shown along a time line in FIG. 2. At (a) is shown a segment 26 of length $L_D$ representing delay as caused by uncertain delays of the channel, processing etc., and segment 27 of length $L_{TW,a}$ representing a long trip window for a typical existing pilot protection scheme. At (b) is shown a segment 28 of length $L_{TW,b}$ representing a short trip window as provided for by the present invention based on time synchronization. The segments in (a) and (b) are not necessarily drawn to scale, but in any case, $L_{TW,b}<L_{TW,a}$. For example, $L_{TW,b}$ may be an order of magnitude smaller than $L_{TW,a}$.

As shown in FIG. 2, for existing pilot protection schemes, since the data is unsymmetrical and the time delay is uncertain, a long hold time and long trip window, for example, say 50 ms, must be employed to ensure stable protection logic cooperation between the terminals A, B. For the herein proposed travelling wave pilot protection of a transmission line, which is based on time synchronization, the uncertain delay is removed by the use of time synchronization and assuming a small synchronization error (e.g. smaller than 0.2 ms). The arrival times of the travelling wave at the two terminals A, B are almost identical to each other. Thereby, the trip time window may be very short to ensure the detections of the travelling waves at different terminals are from the same event. For example, as noted above this short window may only be 2-6 ms long.

In existing pilot protection schemes based on unsymmetrical data, the hold time could be as long as 50 ms. Assume that the actual total delay (communication delay, processing delay etc.) is 10 ms. The actual trip window thus is 50-10=40 ms, whilst for the herein proposed travelling wave pilot protection of a transmission line based time synchronization, the trip window may be just 2 ms long, i.e., having a length being 1/20 of that of existing schemes. This means that the mal-trip risk in the proposed scheme also becomes 1/20 compared with existing pilot protection schemes, assuming the same algorithm is used for the two schemes and only the time synchronization aspect is different.

It should also be noted that harmonics and noise may also cause wrong external fault detection, which will block the trip for some time. It may even lead to failure of fault detection (decreased dependability). The synchronization and short trip window will improve the dependability of pilot protection schemes in addition to its contribution to the security of protection.

Figure 3A:
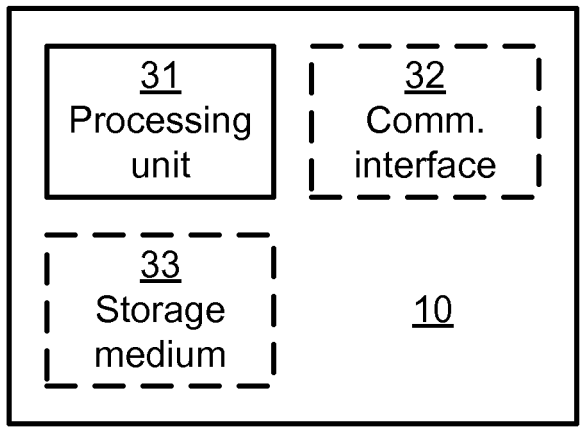
FIG. 3a is a schematic diagram showing functional units of an arrangement according to an embodiment.

FIG. 3a schematically illustrates, in terms of a number of functional units, the components of an arrangement 10a, 10b, 10c for travelling wave pilot protection of a transmission line according to an embodiment. A processing unit 31 is provided using any combination of one or more of a suitable central processing unit (CPU), multiprocessor, microcontroller, digital signal processor (DSP), application specific integrated circuit (ASIC), field programmable gate arrays (FPGA) etc., capable of executing software instructions stored in a computer program product 41 (as in FIG. 4), e.g. in the form of a storage medium 33. Thus the processing unit 31 is thereby arranged to execute methods as herein disclosed. The storage medium 33 may also comprise persistent storage, which, for example, can be any single one or combination of magnetic memory, optical memory, solid state memory or even remotely mounted memory.

The arrangement 10a, 10b, 10c may further comprise a communications interface 32. As such the communications interface 32 may comprise one or more transmitters and receivers, comprising analogue and digital components for communications with at least one other arrangement 10a, 10b, 10c, at least one of current and voltage transformer 22a, 22b, and at least one circuit breaker 23a, 23b.

The processing unit 31 controls the general operation of the arrangement 10a, 10b, 10c e.g. by sending data and control signals to the communications interface 32 and the storage medium 33, by receiving data and reports from the communications interface 32, and by retrieving data and instructions from the storage medium 33. Other components, as well as the related functionality, of the arrangement 10a, 10b, 10c are omitted in order not to obscure the concepts presented herein.

The arrangement 10a, 10b, 10c may be implemented in an electronic device. For example, at least the processing unit 31 may be part of an Intelligent Electronic Device (IED) such as a protective relay, comprised in the arrangement 10a, 10b, 10c. Hence, such an electronic device may be configured to perform any step as herein disclosed. Hence, the indications of a travelling wave from two terminals may be acquired by a protective relay placed at one end of the transmission line 20.

In this respect, it should be mentioned that a protective relay is different from a so-called fault locator. A fault locator is used to detect the fault location and is not a real-time device. Further, a fault locator outputs fault location with kilometers. It will never trip circuit breaker. In contrast, a protection relay is a device operating in real-time to detect whether the fault is inside or outside the protected zone. The protection relay is connected to a circuit breaker and will trip the circuit breaker if the fault is inside the protected zone.

Figure 3B:
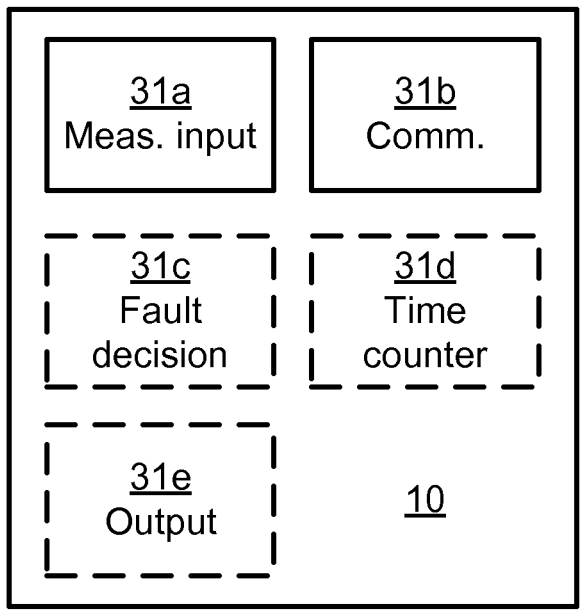
FIG. 3b is a schematic diagram showing functional modules of a protection device according to an embodiment.

FIG. 3b schematically illustrates, in terms of a number of functional modules, the components of an arrangement 10a, 10b, 10c embodied as a travelling wave pilot protection mechanism according to an embodiment. The arrangement 10a, 10b, 10c of FIG. 3b comprises a number of functional modules; a measurement input module 31a, a communications module 31b, a fault decision module 31c, a time counter module 31d, and an output module 31e.

The measurement input module 31a is configured to receive indications of a travelling wave from two terminals A, B of the transmission line 20. The communications module 31b is configured to provide the data and information, such as the indications, to the fault decision module 31c. The fault decision module 31c is configured to, upon reception of the first of these indications, via the communications module 31b, trigger the time counter module 31d to start counting time. The fault decision module 31c is further configured to, upon reception of the second of these indications, via the communications module 31b, trigger the time counter module 31d to stop counting time. The time counter module 31d is configured to, via the communications module 31b, provide a result of the counting of time to the fault decision module 31c. The fault decision module 31c is further configured to, based on the result received from the time counter module 31d make a trip decision. The output module 31e is configured to send the trip decision to one or more circuit breakers 23a, 23b.

In general terms, each functional module 31a-31e may be implemented in hardware or in software. Preferably, one or more or all functional modules 31a-31e may be implemented by the processing unit 31, possibly in cooperation with functional units 32 and/or 33. The processing unit 31 may thus be arranged to from the storage medium 33 fetch instructions as provided by a functional module 31a-31e and to execute these instructions, thereby performing any steps S102, S104, S104a, S104b as disclosed above.

Figure 4:
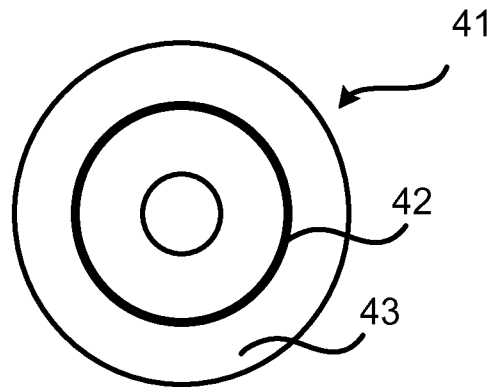
FIG. 4 shows one example of a computer program product comprising computer readable means according to an embodiment.

FIG. 4 shows one example of a computer program product 41 comprising computer readable means 43. On this computer readable means 43, a computer program 42 can be stored, which computer program 42 can cause the processing unit 31 and thereto operatively coupled entities and devices, such as the communications interface 32 and the storage medium 33, to execute methods according to embodiments described herein. The computer program 42 and/or computer program product 41 may thus provide means for performing any steps as herein disclosed.

In the example of FIG. 4, the computer program product 41 is illustrated as an optical disc, such as a CD (compact disc) or a DVD (digital versatile disc) or a Blu-Ray disc. The computer program product 41 could also be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory. Thus, while the computer program 42 is here schematically shown as a track on the depicted optical disk, the computer program 42 can be stored in any way which is suitable for the computer program product 41.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

The invention claimed is:

1. A method for travelling wave pilot protection of a transmission line, the method comprising:
   receiving indications of travelling waves from two terminals of the transmission line, the two terminals being time synchronized;
   checking whether the indications from the two terminals occur within a short trip window;
   confirming, based on the checking, that the indications from the two terminals relate to a same travelling wave; and
   making a trip decision based on the confirming that the indications from the two terminals relate to the same travelling wave.

2. The method according to claim 1, wherein the confirming further comprises:
   confirming that the indications from the two terminals relate to the same travelling wave in response to the indications being received within a time distance of each other, the time distance corresponding to the short trip window.

3. The method according to claim 2, wherein the confirming is preceded by:
   time compensating at least one of the indications.

4. The method according to claim 1, wherein the indications represent a fault along the transmission line.

5. The method according to claim 4, wherein each indication is provided by synchronized binary information representing at least one of travelling wave polarity, fault direction, blocking signal, unblocking signal, or trip signal for the fault.

6. The method according to claim 2, wherein a fault is detected in response to the indications being received within the short trip window.

7. The method according to claim 1, wherein the terminals have a combined time synchronization error less than 0.2 ms.

8. The method according to claim 1, wherein the short trip window has a length in time corresponding to 2-6 ms.

9. The method according to claim 1, wherein each indication is an arrival time of the same travelling wave at the respective terminal.

10. The method according to claim 1, wherein the trip decision relates to whether or not to cause a circuit breaker to trip.

11. The method according to claim 1, wherein the transmission line is part of a power distribution system.

12. The method according to claim 1, wherein the transmission line is an alternating current (AC) transmission line.

13. The method according to claim 1, wherein the transmission line is a direct current (DC) transmission line.

14. The method according to claim 4, wherein the fault is detected in response to the indications being received within the short trip window.

15. The method according to claim 5, wherein the fault is detected in response to the indications being received within the short trip window.

16. An arrangement for travelling wave pilot protection of a transmission line, the arrangement having a processing unit, the processing unit being configured to cause the arrangement to:
   receive indications of travelling waves from two terminals of the transmission line, wherein the two terminals are time synchronized;
   check whether the indications from the two terminals occur within a short trip window;
   confirm, based on the check, that the indications from the two terminals relate to a same travelling wave; and
   make a trip decision based on the confirmation that the indications from the two terminals relate to the same travelling wave.

17. The arrangement according to claim 16, wherein the processing unit configured to cause the arrangement to confirm comprises the processing unit configured to cause the arrangement to:
   confirm that the indications from the two terminals relate to the same travelling wave in response to the indications being received within a time distance of each other corresponding to the short trip window.

18. The arrangement according to claim 16, wherein the processing unit is part of an Intelligent Electronic Device (IED) included in the arrangement.

19. The arrangement according to claim 17, wherein the processing unit is part of an Intelligent Electronic Device (IED) included in the arrangement.

20. The arrangement according to claim 19, wherein the IED is a protective relay.

* * * * *